US008629387B2

(12) United States Patent
Pflibsen et al.

(10) Patent No.: US 8,629,387 B2
(45) Date of Patent: Jan. 14, 2014

(54) MULTI-LAYER SENSOR CHIP ASSEMBLY AND METHOD FOR IMAGING GENERATING IMAGE DATA WITH A FRAME-SUM MODE AND A TIME-DELAY INTEGRATION MODE

(75) Inventors: Kent P. Pflibsen, Tucson, AZ (US); Leonard D. Vance, Tucson, AZ (US); Brian Keith McComas, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 602 days.

(21) Appl. No.: 12/831,694

(22) Filed: Jul. 7, 2010

(65) Prior Publication Data
US 2012/0006971 A1  Jan. 12, 2012

(51) Int. Cl.
H01L 27/00 (2006.01)
H04N 3/14 (2006.01)

(52) U.S. Cl.
USPC .................................. 250/208.1; 348/295

(58) Field of Classification Search
USPC ....... 250/208.1, 206, 214 R, 214.1, 334, 332;
348/241, 295, 296, 294, 302; 341/161,
341/155, 157, 163; 257/291, 292, 257, 258,
257/431, 443, 444, 461, 290
See application file for complete search history.

(56) References Cited

U.S. PATENT DOCUMENTS

| | | | |
|---|---|---|---|
| 5,452,004 A | | 9/1995 | Roberts |
| 5,909,026 A | * | 6/1999 | Zhou et al. ................. 250/208.1 |
| 6,252,217 B1 | | 6/2001 | Pyyhtia et al. |
| 6,362,482 B1 | * | 3/2002 | Stettner et al. ........... 250/370.08 |
| 6,515,285 B1 | * | 2/2003 | Marshall et al. .............. 250/352 |
| 6,693,670 B1 | | 2/2004 | Stark |
| 6,977,685 B1 | * | 12/2005 | Acosta-Serafini et al. ... 348/308 |
| 7,129,509 B2 | * | 10/2006 | Katzir et al. ............. 250/559.45 |
| 7,206,062 B2 | | 4/2007 | Asbrock et al. |
| 7,532,242 B1 | | 5/2009 | Chen |

(Continued)

FOREIGN PATENT DOCUMENTS

WO    WO-2012/005749 A1    1/2012

OTHER PUBLICATIONS

"International Application Serial No. PCT/US2011/000783, International Search Report mailed Jul. 20, 2011", 2 pgs.

(Continued)

*Primary Examiner* — Que T Le
*Assistant Examiner* — Jennifer Bennett
(74) *Attorney, Agent, or Firm* — Schwegman, Lundberg & Woessner, P.A.

(57) ABSTRACT

An integrated circuit for generating image data comprises a focal-plane array of unit cells, a controller, and a memory structure having a plurality of storage locations. Each unit cell may store charge based on detected photons. The controller may read a value based on the stored charge from at least some of the unit cells, and either add the read value to an existing value in the corresponding storage location when operating in frame-sum mode, or add the read value to an existing value in a shifted storage location when operating in time-delay integration (TDI) mode. This may allow faint objects as well as objects moving in the field-of-view of the focal-plane array to be observed. The integrated circuit may be fabricated from radiation-hardened CMOS technology and may be a layer of a sensor chip assembly.

18 Claims, 4 Drawing Sheets

(56) References Cited

U.S. PATENT DOCUMENTS

| 7,884,871 | B2* | 2/2011 | Smith et al. ............... 348/308 |
| 2004/0000630 | A1* | 1/2004 | Spartiotis et al. .......... 250/208.1 |
| 2006/0181627 | A1 | 8/2006 | Farrier |
| 2006/0232760 | A1 | 10/2006 | Asbrock et al. |
| 2007/0075888 | A1 | 4/2007 | Kelly et al. |
| 2009/0115994 | A1 | 5/2009 | Stettner et al. |

OTHER PUBLICATIONS

"International Application Serial No. PCT/US2011/000783, Written Opinion mailed Jul. 20, 2011", 5 pgs.

"International Application Serial No. PCT/US2011/000783, International Preliminary Report on Patentability mailed Jan. 17, 2013", 7 pgs.

* cited by examiner

MULTI-LAYER INTEGRATED SENSOR CHIP ASSEMBLY (SCA)

MULTI-LAYER SENSOR CHIP ASSEMBLY AND METHOD FOR IMAGING GENERATING IMAGE DATA WITH A FRAME-SUM MODE AND A TIME-DELAY INTEGRATION MODE

TECHNICAL FIELD

Embodiments pertain to radiation-hardened integrated circuits for optical imaging including read-out integrated circuits (ROICs) with time-domain integration (TDI) capability. Some embodiments relate to sensor-chip assemblies, and some embodiments relate to optical systems.

BACKGROUND

Many conventional optical sensors utilize charge-coupled device (CCD) technology. The CCD technology has a very low radiation tolerance which impacts performance and device lifetime particularly in space environments. Conventional sensors that use CCD technology are difficult to shield from the effects of radiation when provided on orbiting satellites.

Thus, what is also needed is a light sensitive integrated circuit suitable for use in an optical system that is radiation-hardened and may be suitable for use on orbiting satellites. An integrated circuit for imaging that allows for longer integration times to improve sensitivity in optical systems, particularly small-aperture optical systems, is also needed. In addition, an integrated circuit for imaging that can be configured to compensate for linear motion and/or rotational motion of the optical system and/or the object being imaged is needed. Also needed is an integrated circuit suitable for use in an optical system that can detect faint objects at extreme ranges. What is also needed is a radiation-hardened, TDI capable, photon-counting integrated sensor-chip assembly (SCA).

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
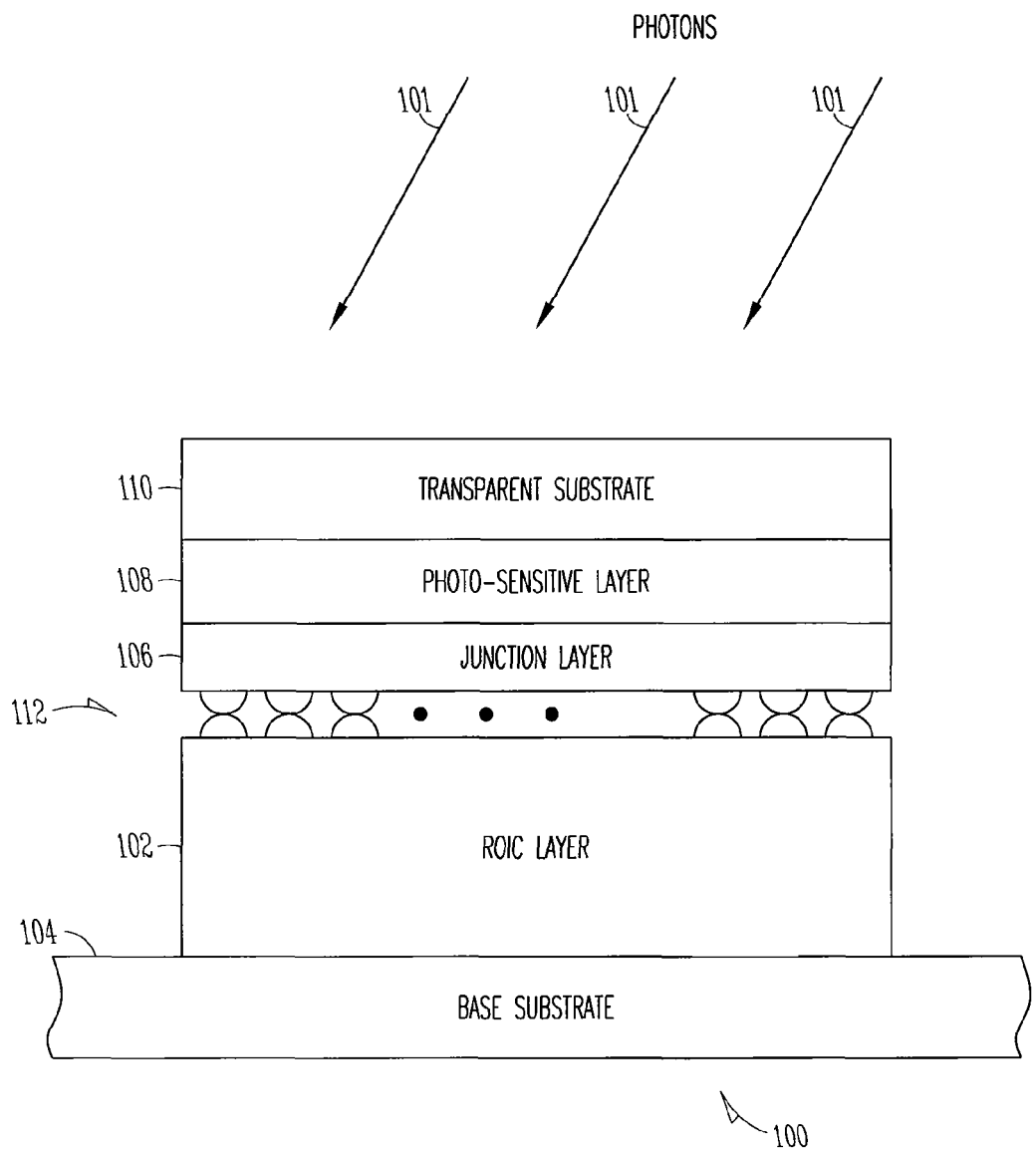
FIG. 1 illustrates a multi-layer integrated SCA, in accordance with some embodiments.

FIG. 1 illustrates a multi-layer integrated SCA, in accordance with some embodiments. SCA 100 may comprise a plurality of layers including a read-out integrated circuit (ROIC) layer 102 mounted on a base substrate 104 and a photo-sensitive layer 108. The SCA 100 may also include a transparent substrate 110 on which the photo-sensitive layer 108 may be grown or deposited, and a junction layer 106 which may define a photo-sensitive area for each unit cell of the ROIC layer 102. The SCA 100 may also include a connection layer 112 to connect elements of the photo-sensitive layer 108 and junction layer 106 with the ROIC layer 102. In some embodiments, the connection layer 112 may comprise indium bumps; however, other connection techniques are also suitable. The base substrate 104 may provide structure stability and thermal conduction for the SCA 100.

In accordance with embodiments, the ROIC layer 102 may comprise a focal-plane array of unit cells. Each unit cell may be configured to store charge based on photons 101 detected by the photo-sensitive elements of the photo-sensitive layer 108. The ROIC layer 102 may also include a controller to cause the ROIC layer 102 to operate in either frame-sum mode or time-delay integration (TDI) mode and a memory structure having a plurality of storage locations. Each storage location may correspond to one of the unit cells. The operation of the ROIC layer 102 is discussed in more detail below.

In some embodiments, the ROIC layer 102 may be fabricated on a single semiconductor layer, in accordance with a complimentary metal-oxide semiconductor (CMOS) technology, or fabricated on a Gallium-Arsenide (GaAs) substrate or similar material. The photo-sensitive layer 108 may comprise a photosensitive material layer such as a silicon-based layer, although this is not a requirement. The photo-sensitive layer 108 may be configured to be sensitive to a predetermined wavelength of light.

Figure 2:
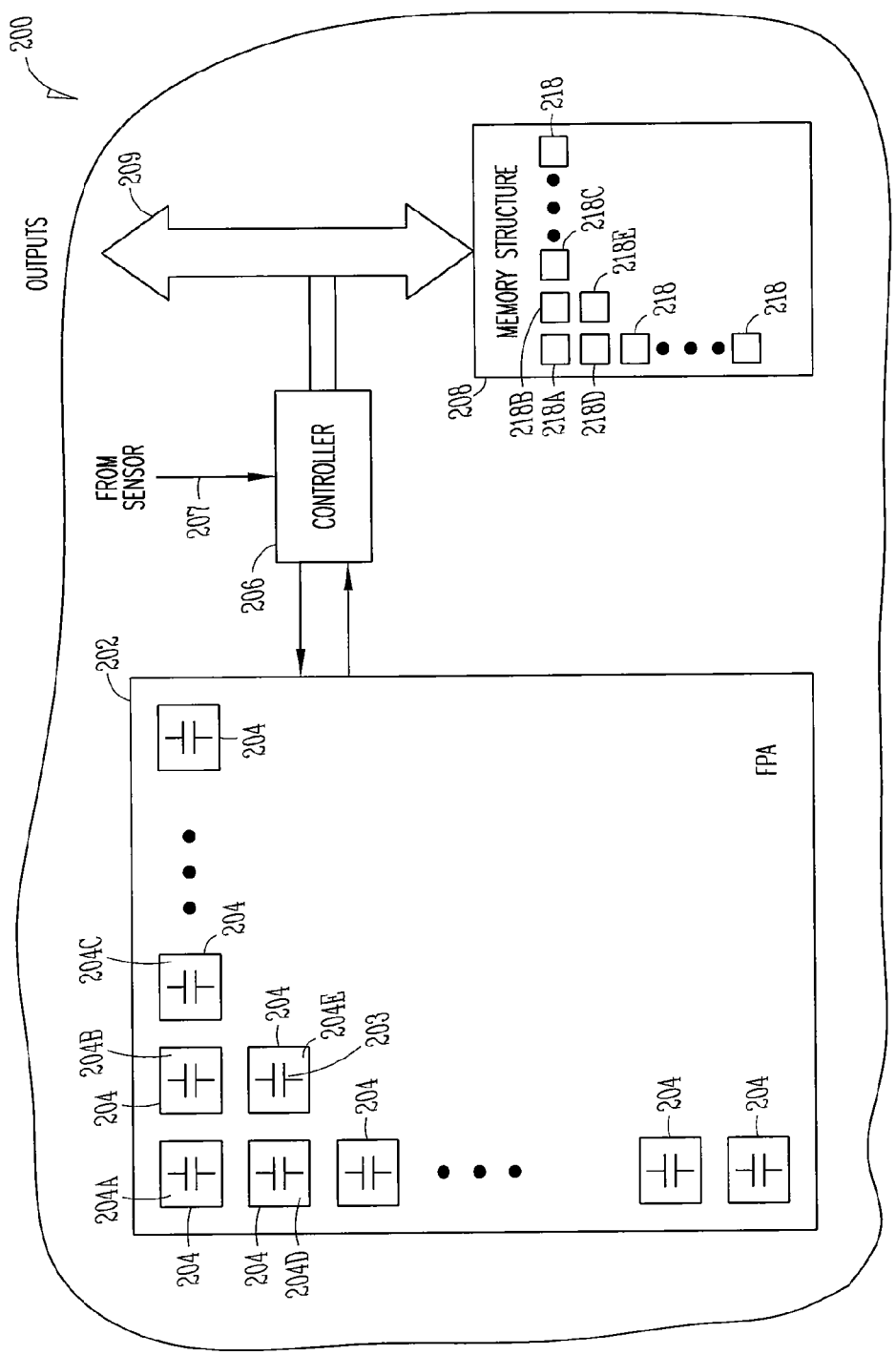
FIG. 2 is an integrated circuit with TDI capability, in accordance with some embodiments.

FIG. 2 is an integrated circuit with TDI capability, in accordance with some embodiments. Integrated circuit 200 may be suitable for use as ROIC layer 102 (FIG. 1) as part of SCA 100 (FIG. 1). In accordance with embodiments, the integrated circuit 200 comprises a focal-plane array (FPA) 202 of unit cells 204. Each unit cell 204 is configured to store charge based on detected photons 101 (FIG. 1). The integrated circuit 200 may also include a controller 206 and a memory structure 208 having a plurality of storage locations 218. Each storage location 218 may correspond to one of the unit cells 204. In accordance with embodiments, the controller 206 is configured to read a value based on the stored charge from at least some of the unit cells 204. The controller 206 may also be configured to add the read value to an existing value in the corresponding storage location 218 when operating in frame-sum mode. The controller 206 may also be configured to add the read value to an existing value in a shifted storage location 218 when operating in TDI mode. The shifted storage location may be a storage location 218 that corresponds to a unit cell 204 having a location that is shifted over by one or more unit cells 204 in the FPA 202 from the corresponding unit cell 204. The FPA 202 may comprise a matrix of unit cells 204 provided within a field-of-view (FOV) of the SCA 100 or an optical system.

In these embodiments, the integrated circuit 200 may be configured to operate as a ROIC with TDI capability. The storing of values in the memory structure 208 on the same integrated circuit 200 as the FPA 202 may provide for significantly faster frame-transfer capabilities than conventional sensors.

Integrated circuit 200 may be radiation-hardened and suitable for use in an optical system on orbiting satellites. Integrated circuit 200 may also be suitable for imaging by allowing for longer integration times to improve sensitivity in optical systems, particularly small-aperture optical systems. Integrated circuit 200 may be configured to compensate for linear motion and/or rotational motion of an optical system and/or the object being imaged. Integrated circuit 200 may also be suitable for the detection of faint objects at extreme ranges. Integrated circuit 200 may also be suitable for use in a radiation-hardened, TDI capable, photon-counting SCA, such as multi-layer integrated SCA 100.

As discussed above, when operating in TDI mode, the shifted storage location may be a storage location 218 that corresponds to a unit cell 204 having a location that is shifted over by one or more unit cells 204 in the FPA 202 from its corresponding unit cell 204. For example, storage location 218A may correspond to unit cell 204A, storage location 218B may correspond to unit cell 204B, storage location 218C may correspond to unit cell 204C, storage location 218D may correspond to unit cell 204D, and storage location 218E may correspond to unit cell 204E. When operating in frame-sum mode, the controller 206 may add the value based on the stored charge from unit cell 204A to the existing value in storage location 218A, add the value based on the stored charge from unit cell 204B to the existing value in storage location 218B, add the value based on the stored charge from unit cell 204C to the existing value in storage location 218C, add the value based on the stored charge from unit cell 204D to the existing value in storage location 218D, and add the value based on the stored charge from unit cell 204E to the existing value in storage location 218E.

When operating in TDI mode, the controller may shift the storage location by one or more positions prior to adding. For example, when the shift is equal to one pixel in the horizontal direction, the controller 206 may add the value based on the stored charge from unit cell 204A to the existing value in storage location 218B, add the value based on the stored charge from unit cell 204B to the existing value in storage location 218C, add the value based on the stored charge from unit cell 204C to the existing value in the storage location next to storage location 218C, add the value based on the stored charge from unit cell 204D to the existing value in storage location 218E, and add the value based on the stored charge from unit cell 204E to the existing value in storage location next to storage location 218E, and so on. In these embodiments, the location that the value is stored in may be shifted along rows and/or columns by a whole number of pixels that is less than the array size.

In accordance with embodiments, each unit cell 204 may include a capacitive element 203 to store charge in proportion to current from a photo-sensitive element. The controller 206 may be further configured to allow the charge to accumulate on the capacitive elements 203 of the unit cells 204 for an integration time prior to reading the value from the unit cells. The controller 206 may be further configured to reset each unit cell 204 after reading the value by discharging the capacitive elements 203 of the unit cells 204. In these embodiments, the amount of charge stored may be in proportion to current from photons detected by the photo-sensitive element, such as a photo diode, of a photo-sensitive layer 108 during the integration time. The integration time may refer to the amount of time that charge from detected photons is allowed to accumulate on the capacitive elements 203 of the unit cells 204.

Although many embodiments described herein are applicable to detecting visible light, the scope of the embodiments is not limited in this respect. In visible-light embodiments, the amount of charge accumulated in unit cells 204 may be proportional to current from a element sensitive to visible light, while in infrared (IR) embodiments, the amount of charge accumulated in unit cells 204 may be proportional to current from an IR sensitive element.

When operating in either frame-sum mode or TDI mode, the controller 206 may also be configured to repeat reading the values from the unit cells 204, repeat adding the read values to a storage location 218, and repeat resetting the unit cells over an observation time to accumulate values in the storage locations 218. The observation time refers to the time during which values are added (e.g., accumulated) in the storage locations 218 during either frame-sum mode or TDI mode. The controller 206 may also provide the values accumulated in the storage locations 218 as outputs 209. The outputs 209 provided may comprise image data corresponding to a frame. In some embodiments, the outputs 209 from storage locations 218 are provided in serial form to a field-programmable gate array (FPGA) of a sensor device that is external to integrated circuit 200. In some embodiments, for each frame of a plurality of frames, the controller 206 may be configured to clear the storage locations 218 of the memory structure 208 after providing the value stored therein as outputs 209. The controller 206 may repeat the process for a next frame.

As discussed above, during TDI mode, the storage location 218 for storing the value read from a unit cell 204 is shifted by a number of pixels that is less than the array size. The number of pixels shifted may be determined by a system controller external to the integrated circuit 200 and may be based on a speed of an object being observed in relation to a FOV of the FPA 202. In some embodiments, for a faster moving object in the FOV, the number of pixels shifted is greater than for a slower moving object in the FOV. The number of pixels shifted may be dynamically updated by the system controller as the speed of the object being observed in relation to the FOV changes.

The storage location may be shifted by one or more pixels either horizontally (e.g., in the x-direction), vertically (e.g., in the y-direction) or diagonally (e.g., by one or more pixels in the x-direction and by one or more pixels in the y-direction). For example, if the array size is 1000×1000 pixels, the number of pixels that the location for storing a value may be shifted by a value to remain within the array depending on the relative speed of the object.

The controller 206 may also be configured to receive a control signal 207 indicating whether to operate in frame-sum mode or TDI mode. The control signal 207 may also indicate the number of pixels (or storage locations) to shift for operating in TDI mode. The integrated circuit 200 may be configured to operate in frame-sum mode when observing objects that are stationary within the FOV of the FPA 202 and when observing faint objects (e.g., objects near or below the noise floor). Frame-sum mode may help reduce noise and improve the signal-to-noise ratio (SNR) within an image. The integrated circuit 200 may operate in TDI mode when observing objects that are moving within the FOV of the FPA 202, including when observing objects that are moving across the FPA 202. A system controller of a sensor device external to integrated circuit 200 may provide the mode indication to the controller 206 as part of the control signal 207. In some embodiments, the number of pixels to shift the storage locations in TDI mode may be determined based on the rate at which an observed object is moving within the FPA 202.

The system controller may also provide the observation time to the controller 206 as part of control signal 207. The observation time may be provided as an input to the integrated circuit 200 and may range from one microsecond to up to several seconds in duration. The observation time may initially be longer for observing further away or faint objects. The observation time may be reduced for closer and brighter objects and when saturation occurs.

In some embodiments, the control signal 207 may further indicate a direction within the FPA 202 to shift corresponding storage locations 218 by the number of pixels when operating in TDI mode. The number of pixels and the direction to shift may compensate for motion, including rotational motion and linear motion, of an optical system with respect to an object being observed.

In some embodiments, the unit cells 204 of the FPA 202, the controller 206 and the memory structure 208 are fabricated on a single semiconductor substrate layer and may correspond to the ROIC layer 102. The semiconductor material may comprise a radiation-hardened technology such as CMOS technology or GaAs. The use of a radiation-hardened technology allows the integrated circuit 200 to be significantly more radiation tolerant than conventionally fabricated devices. This may help improve the performance of an SCA particularly in space environments. Furthermore, the SCA would not need to be shielded from the effects of radiation when provided on orbiting satellites.

As discussed above, the integrated circuit 200 may be a layer of a multi-layer SCA, such as SCA 100. In these embodiments, the integrated circuit 200 may be mounted on the base substrate layer 104. A photo-sensitive layer, such as photo-sensitive layer 108 (FIG. 1), comprising photo-sensitive elements may provide charge to the unit cells 204. The photo-sensitive elements may comprise either photo-diodes or photo transistors fabricated on the photo-sensitive layer 108. The photo-sensitive layer 108 may be a silicon-based layer and the photo-sensitive elements may comprise either silicon-based photo-diodes or silicon-based photo transistors.

In a monolithic embodiment that uses a silicon-based photo-sensitive layer, the photo-sensitive layer 108 may be fabricated on the same piece of silicon as elements the integrated circuit 200 including the controller 206 to provide ROIC functionality on a single silicon component. In some IR embodiments, a strained super-lattice technology with an IR sensitive super-lattice sensor may be fabricated on the same piece of silicon with the elements of integrated circuit 200 including the controller 206 to provide ROIC functionality that can be cooled to an appropriate operating temperature.

In addition to frame-sum mode and TDI mode, the integrated circuit 200 may be configured to operate in a standard mode during which the controller 206 allows each unit cell 204 to accumulate charge for an integration time prior to reading a value from each unit cell 204 and providing the values from the unit cell as outputs 209. When operating in the standard mode, the controller 206 may refrain from adding values based on the stored charge to existing values in storage locations 218. The control signal 207 may indicate to controller 206 whether to operate in standard mode and may also indicate the integration time to allow each unit cell 204 to accumulate charge from photons 101.

In some embodiments, the controller 206 may provide outputs 209 corresponding to a portion of the FPA 202 that is less than the entire FPA. This may provide for faster operation of the integrated circuit 200 by providing outputs that correspond to an object of interest that is in the field-of-view of the FPA 202 and refraining from providing outputs that correspond to areas of the FPA 202 that are not of interest.

In some embodiments, the controller 206 may all values to accumulate in the storage locations 218 from a selected portion of the FPA 202 for imaging an object of interest in the selected portion. In these embodiments, the control signal 209 may indicates the portion of the FPA 202 for generating outputs. These embodiments allow a portion of the array to be selectively read-out and may allow images of faint objects in the selected portion of the FPA 202 to be generated without saturation that may be caused by a bright object in the field-of-view of the FPA 202. Accordingly, faint objects that may not have been able to be imaged may be imaged more clearly and brighter objects may be excluded. This may provide for faster operation of the integrated circuit 200.

Although integrated circuit 200 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs) and combinations of various hardware and logic circuitry for performing at least the functions described herein. In some embodiments, the functional elements of integrated circuit 200 may refer to one or more processes operating on one or more processing elements. Integrated circuit 200 may also include other functional elements not illustrated in FIG. 2.

Figure 3:
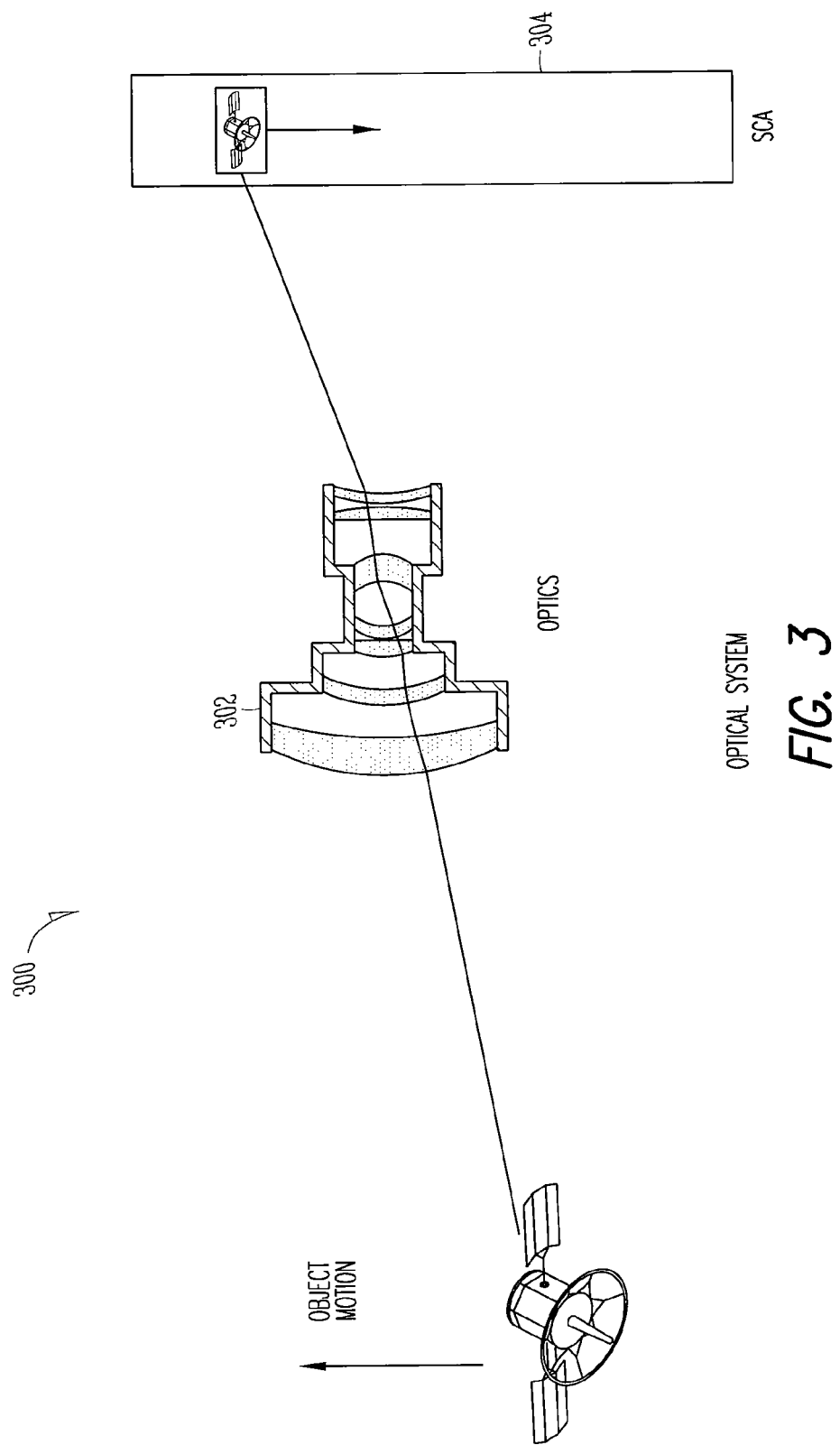
FIG. 3 is an optical system, in accordance with some embodiments.

FIG. 3 is an optical system, in accordance with some embodiments. Optical system 300 may include, among other things, system optics 302 and SCA 304. SCA 100 (FIG. 1) may be suitable for SCA 304 and may include an integrated circuit layer such as integrated circuit 200 (FIG. 2), which may operate in a TDI mode as well as frame-sum mode. The system optics 302 may direct an image onto the SCA 304. During TDI mode, the storage locations may be shifted in concert with a line-of-site of the optical system to counter linear image motion, as illustrated in FIG. 3. The optical system 300 may be a small-aperture optical system that employs a radiation-tolerant CMOS SCA with TDI capability suitable for orbiting satellites, including geo-earth-orbiting (GEO) or medium-earth-orbiting (MEO) satellites. The optical system 300 may also be suitable for use as a ground based optical system for detecting faint objects which may be moving.

Figure 4:
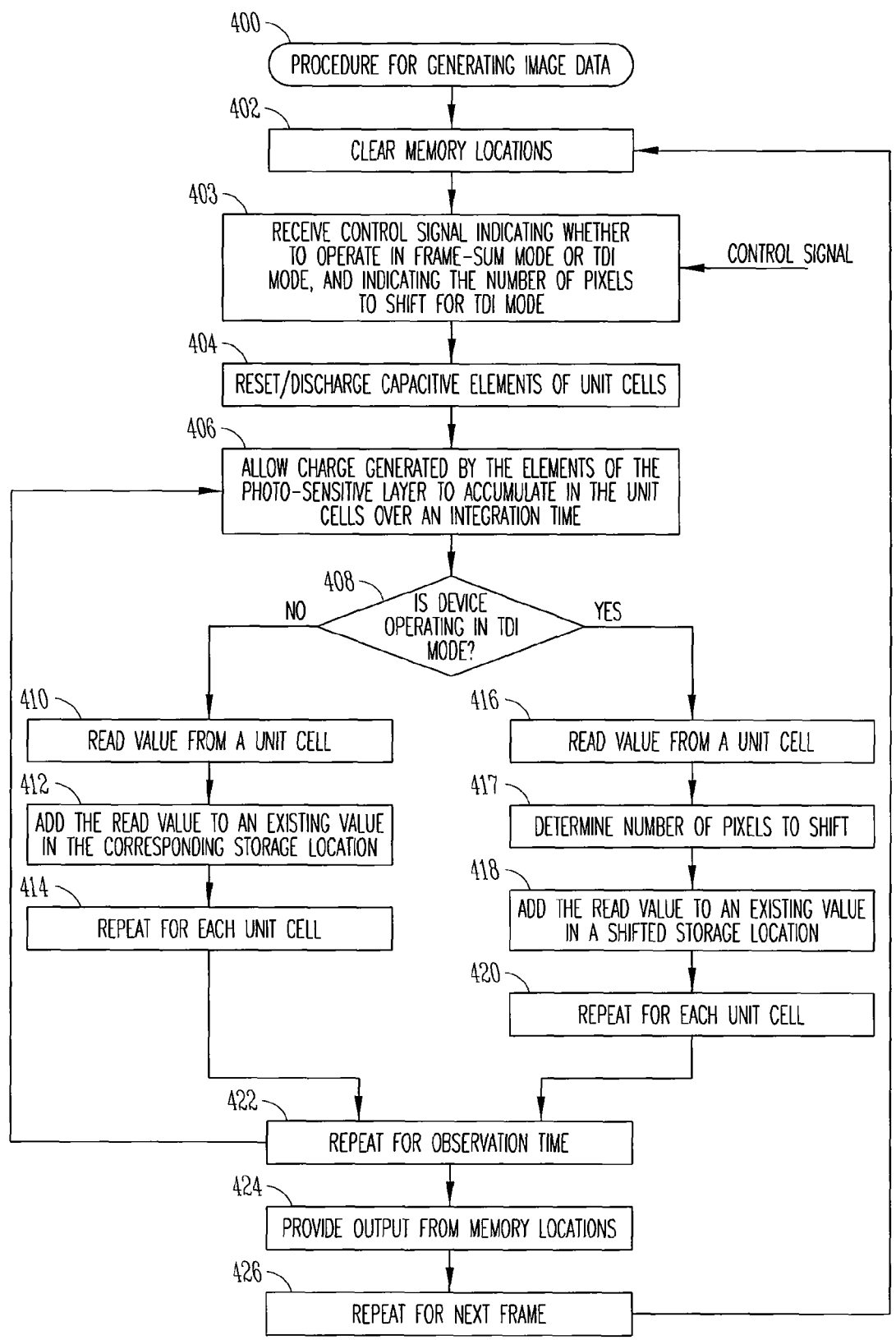
FIG. 4 is a procedure for generating image data, in accordance with some embodiments.

FIG. 4 is a procedure for generating image data, in accordance with some embodiments. Procedure 400 may be performed by a controller, such as controller 206 (FIG. 2), of an integrated circuit, such as integrated circuit 200 (FIG. 2). Procedure 400 may be performed for generating image data in either a frame-sum mode or a TDI mode. In addition to the controller, the integrated circuit may have a focal-plane array of unit cells configured to store charge based on detected photons and a memory structure having a plurality of storage locations. Each storage location may correspond to one of the unit cells.

In operation 402, the storage locations of the memory structure may be cleared. In operation 403, the controller may receive a control signal indicating whether to operate in frame-sum mode or TDI mode. When indicating to operate in TDI mode, the control signal may also indicate the number of pixels to shift. The control signal may correspond to control signal 207 (FIG. 2).

In operation 404, the capacitive elements of the unit cells may be discharged (e.g., reset).

In operation 406, charge may be allowed to accumulate on the capacitive elements of the unit cells. The charge may be a result of photons detected by the photo-sensitive layer 108 (FIG. 1). The charge may be allowed to accumulate for an integration time.

Operation 408 causes the controller to perform operations 410-414 when operating in frame-sum mode and to perform operations 416 through 420 when operating in TDI mode.

In operation 410, the value is read from a unit cell and is added to the existing value in the corresponding storage location in operation 412. Operation 414 causes operations 410 and 412 to be repeated for at least some or all of the unit cells. After a value is read from a unit cell in operation 410, the unit cell may be reset.

In operation 416, the value is read from a unit cell. In operation 417, the controller may determine the number of storage locations (corresponding to the number of pixels) to shift based on the indicating from the control signal. In operation 418, the read value is added to a shifted storage location, in accordance with TDI mode as discussed above. The number of storage locations to shift may be updated as the speed of the object with respect to the FOV changes.

Operation 420 causes operations 416 through 418 to be repeated for at least some or all of the unit cells. After a value is read from a unit cells in operation 416, the unit cell may be reset.

In operation 422, operation 406 and either operations 410 through 414 or operations 416 through 420 are repeated. This allows the values to be accumulated in the storage locations for the observation time.

In operation 424, the outputs from at least some of the storage locations are provided as imaging data. The outputs may correspond to one frame of data. After operation 424, operation 426 may be performed in which the various operations of procedure 400 may then be performed for the next frame.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An integrated circuit for generating image data, the integrated circuit comprising:
   a focal-plane array of unit cells, each unit cell to store charge based on detected photons;
   a controller configurable to operate in both frame-sum mode and time-delay integration (TDI) mode; and
   a digital memory structure coupled to the controller by a bus, the memory structure having a plurality of storage locations, each storage location to store a digital value and being individually addressable by the controller, each of the unit cells being associated with a corresponding storage location,
   wherein the controller is configured to:
   determine a digital value based on the stored charge from at least some of the unit cells;
   add the determined digital value to an existing value in the corresponding storage location when operating in frame-sum mode; and
   add the determined digital value to an existing value in a shifted storage location when operating in TDI mode, the shifted storage location being a storage location that corresponds to a unit cell shifted by one or more unit cells in a direction within the focal-plane array from the corresponding unit cell, the direction configurable by the controller to be any direction within the focal-plane array including an x-direction, a y-direction and a diagonal direction,
   wherein during TDI mode, the storage location for storing the digital value determined from a unit cell is shifted by a number of pixels that is based on a speed of an object being observed in relation to a field-of-view (FOV) of the focal-plane array, the number of pixels being up to a size of the focal-plane array, and
   wherein the number of pixels and the direction to shift are to compensate for motion, including rotational motion and linear motion, of an object being observed.

2. The integrated circuit of claim 1 wherein each unit cell comprises a capacitive element to store charge in proportion to current from a photo-sensitive element,
   wherein the controller is further configured to:
   allow the charge to accumulate on the capacitive elements of the unit cells for an integration time prior to determining the value from the unit cells; and
   reset each unit cell after determining the value by discharging the capacitive elements of the unit cells.

3. The integrated circuit of claim 2 wherein when operating in either frame-sum mode or TDI mode, the controller is further configured to:
   repeat the determining, adding and resetting for an observation time to accumulate values in the storage locations; and
   provide the digital values accumulated in the storage locations as outputs,
   wherein the outputs provided comprise digital image data corresponding to a frame.

4. An integrated circuit for generating image data, the integrated circuit comprising: a focal-plane array of unit cells, each unit cell to store charge based on detected photons; a controller configurable to operate in both frame-sum mode and time-delay integration (TDI) mode; and a digital memory structure coupled to the controller by a bus, the memory structure having a plurality of storage locations, each storage location to store a digital value and being individually addressable by the controller, each of the unit cells being associated with a corresponding storage location, wherein the controller is configured to: determine a digital value based on the stored charge from at least some of the unit cells; add the determined digital value to an existing value in the corresponding storage location when operating in frame-sum mode; and add the determined digital value to an existing value in a shifted storage location when operating in TDI mode, the shifted storage location being a storage location that corresponds to a unit cell shifted over by one or more unit cells in the focal-plane array from the corresponding unit cell, wherein during TDI mode, the storage location for storing the digital value determined from a unit cell is shifted by a number of pixels that is based on a speed of an object being observed in relation to a field-of-view (FOV) of the focal-plane array, the number of pixels being up to a size of the focal-plane array, wherein during TDI mode, the storage location for storing the value determined from a unit cell is shifted by a number of pixels that is less than an array size, and wherein for a faster moving object in the FOV, the number of pixels shifted is greater than for a slower moving object in the FOV.

5. The integrated circuit of claim 4 wherein the unit cells of the focal-plane array, the controller and the memory structure are fabricated on a single semiconductor layer comprising either CMOS technology or GaAs.

6. The integrated circuit of claim 5 wherein the integrated circuit comprises an integrated circuit layer of a multi-layer sensor-chip assembly (SCA) comprising a plurality of layers including a base substrate layer and a photo-sensitive layer, and
   wherein the integrated circuit layer is mounted on the base substrate layer and the photo-sensitive layer comprises a plurality of photo-sensitive elements to provide charge to the unit cells.

7. The integrated circuit of claim 4 wherein the integrated circuit is further configurable to operate in a standard mode during which the controller is configured to allow each unit cell to accumulate charge for an integration time prior to determining a value from each unit cell and providing the values from the unit cell as outputs, and
   wherein when operating in standard mode, the controller is configured to refrain from adding values determined based on stored charge of the unit cells to existing values in the storage locations.

8. The integrated circuit of claim 4 wherein the controller is further configured to provide outputs corresponding to a portion of the focal-plane array that is less than the entire focal-plane array.

9. The integrated circuit of claim 4 wherein the controller is further configured to accumulate values in the storage locations from a selected portion of the focal-plane array for imaging an object in the selected portion.

10. An integrated circuit for generating image data, the integrated circuit comprising: a focal-plane array of unit cells, each unit cell to store charge based on detected photons; a controller configurable to operate in both frame-sum mode and time-delay integration (TDI) mode; and a digital memory structure coupled to the controller by a bus, the memory structure having a plurality of storage locations, each storage location to store a digital value and being individually addressable by the controller, each of the unit cells being associated with a corresponding storage location, wherein the controller is configured to: determine a digital value based on the stored charge from at least some of the unit cells; add the determined digital value to an existing value in the corresponding storage location when operating in frame-sum mode; and add the determined digital value to an existing value in a shifted storage location when operating in TDI mode, the shifted storage location being a storage location that corresponds to a unit cell shifted over by one or more unit cells in the focal-plane array from the corresponding unit cell, wherein during TDI mode, the storage location for storing the digital value determined from a unit cell is shifted by a number of pixels that is based on a speed of an object being observed in relation to a field-of-view (FOV) of the focal-plane array, the number of pixels being up to a size of the focal-plane array, wherein the controller is further configured to receive a control signal indicating whether to operate in frame-sum mode or TDI mode and indicating a number of pixels to shift for operating in TDI mode, wherein the control signal further indicate a direction within the focal-plane array to shift corresponding storage locations by the number of pixels, and wherein the number of pixels and the direction to shift are to compensate for motion, including rotational motion and linear motion, of an optical system with respect to an object being observed.

11. A method of generating image data with an integrated circuit having a focal-plane array of unit cells configured to store charge based on detected photons, a controller configurable to operate in both frame-sum mode and time-delay integration (TDI) mode, and a digital memory structure having a plurality of storage locations, each storage location to store a digital value and being individually addressable by the controller, each of the unit cells being associated with a corresponding storage location, wherein the method comprises: determining a digital value based on the stored charge from at least some of the unit cells; adding the determined digital value to an existing value in the corresponding storage location when operating in frame-sum mode; and adding the determined digital value to an existing value in a shifted storage location when operating in TDI mode, wherein during TDI mode, the storage location for storing the digital value determined from a unit cell is shifted by a number of pixels that is based on a speed of an object being observed in relation to a field-of-view (FOV) of the focal-plane array, the number of pixels being up to a size of the focal-plane array, wherein the shifted storage location is a storage location that corresponds to a unit cell having a location that is shifted over by one or more unit cells in the focal-plane array from the corresponding unit cell.

12. The method of claim 11 further comprising:

allowing charge to accumulate on capacitive elements of the unit cells for an integration time prior to determining the digital value from the unit cells; and resetting each unit cell after reading the value by discharging the capacitive elements of the unit cells.

13. The method of claim 12 further comprising receiving a control signal indicating whether to operate in frame-sum mode or TDI mode, indicating the number of pixels to shift when operating in TDI mode, and indicating a direction within the focal-plane array to shift corresponding storage locations by the number of pixels.

14. A multi-layer sensor-chip assembly comprising a plurality of layers including an integrated circuit layer mounted on a base substrate; and a photo-sensitive layer, wherein the integrated circuit layer comprises:

a focal-plane array of unit cells, each unit cell to store charge based on photons detected by photo-sensitive elements of the photo-sensitive layer;

a controller configurable to operate in both frame-sum mode and time-delay integration (TDI) mode; and a digital memory structure coupled to the controller by a bus, the memory structure having a plurality of storage locations, each storage location to store a digital value and being individually addressable by the controller, each of the unit cells being associated with a corresponding storage location, wherein the controller is configured to add a digital value determined from a unit cell to an existing digital value in the corresponding storage location when operating in frame-sum mode; and add a digital value determined from a unit cell to an existing digital value in a shifted storage location when operating in TDI mode, the shifted storage location being a storage location that corresponds to a unit cell shifted by one or more unit cells in a direction within the focal-plane array from the corresponding unit cell, the direction configurable by the controller to be any direction within the focal-plane array, wherein during TDI mode, the storage location for storing the digital value determined from a unit cell is shifted by a number of pixels that is based on a speed of an object being observed in relation to a field-of-view (FOV) of the focal-plane array, the number of pixels being up to a size of the focal-plane array, and wherein the number of pixels and the direction to shift are to compensate for motion, including rotational motion and linear motion of an object being observed.

15. The multi-layer sensor-chip assembly of claim 14 wherein the controller is configured to:

determine the value based on the stored charge from at least some of the unit cells; and either:

add the determined value to an existing value in the corresponding storage location when operating in frame-sum mode; or add the determined value to an existing value in a shifted storage location when operating in TDI mode, the shifted storage location being a storage location that corresponds to a unit cell shifted over by one or more unit cells in the focal-plane array from the corresponding unit cell.

16. The multi-layer sensor-chip assembly of claim 15 wherein the unit cells of the focal-plane array, the controller and the memory structure are fabricated on a single semiconductor layer comprising either CMOS technology or GaAs, and wherein the photo-sensitive layer is configured to detect a predetermined wavelength of light.

17. An optical system comprising:

a sensor-chip assembly (SCA) comprising a plurality of layers including an integrated circuit layer mounted on a base substrate and a photo-sensitive layer; and system optics to direct an image onto the SCA, wherein the integrated circuit layer comprises:

a focal-plane array of unit cells, each unit cell to store charge based on photons detected by photo-sensitive elements of the photo-sensitive layer;

a controller configurable to operate in both frame-sum mode and time-delay integration (TDI) mode; and a digital memory structure coupled to the controller by a bus, the memory structure having a plurality of storage locations, each storage location to store a digital value and being individually addressable by the controller, each of the unit cells being associated with a corresponding storage location, and wherein the controller of the SCA is configured to:

determine a digital value based on the stored charge from at least some of the unit cells; and add the determined digital value to an existing value in a shifted storage location when operating in TDI mode, the shifted storage location being a storage location that corresponds to a unit cell shifted by one or more unit cells in a direction within the focal-plane array from the corresponding unit cell the direction configurable by the controller to be an direction within the focal-plane array, and wherein during TDI mode, the storage locations are shifted in concert with a line-of-site of the optical system to counter linear image motion, wherein the controller is further configured to receive a control signal indicating whether to operate in frame-sum mode or TDI mode and indicating a number of pixels to shift for operating in TDI mode, wherein the control signal further indicate the direction within the focal-plane array to shift corresponding storage locations by the number of pixels, and wherein the number of pixels and the direction to shift are to compensate for motion, including rotational motion and linear motion, of the optical system with respect to an object being observed.

18. The optical system of claim 14 wherein the shifted storage location is a storage location that corresponds to a unit cell shifted over by one or more unit cells in the focal-plane array from the corresponding unit cell, and wherein the controller of the SCA is configured to add the determined digital value to an existing digital value in the corresponding storage location when operating in frame-sum mode.

\* \* \* \* \*

UNITED STATES PATENT AND TRADEMARK OFFICE
CERTIFICATE OF CORRECTION

PATENT NO. : 8,629,387 B2
APPLICATION NO. : 12/831694
DATED : January 14, 2014
INVENTOR(S) : Pflibsen et al.

It is certified that error appears in the above-identified patent and that said Letters Patent is hereby corrected as shown below:

On the Title page, in column 1, under "(54) Title", line 2, and in the Specification, column 1, line 2, after "FOR", delete "IMAGING", therefor In the Claims In column 8, line 17, in Claim 4, after "comprising:", insert --¶--, therefor In column 8, line 18, in Claim 4, after "photons;", insert --¶--, therefor In column 8, line 20, in Claim 4, after "and", insert --¶--, therefor In column 8, line 25, in Claim 4, after "location,", insert --¶--, therefor In column 8, line 26, in Claim 4, after "to:", insert --¶--, therefor In column 8, line 27, in Claim 4, after "cells;", insert --¶--, therefor In column 8, line 29, in Claim 4, after "and", insert --¶--, therefor In column 8, line 34, in Claim 4, after "cell,", insert --¶--, therefor In column 8, line 39, in Claim 4, after "array,", insert --¶--, therefor In column 8, line 42, in Claim 4, after "and", insert --¶--, therefor In column 9, line 10, in Claim 10, after "comprising:", insert --¶--, therefor In column 9, line 11, in Claim 10, after "photons;", insert --¶--, therefor In column 9, line 13, in Claim 10, after "and", insert --¶--, therefor In column 9, line 18, in Claim 10, after "location,", insert --¶--, therefor In column 9, line 19, in Claim 10, after "to:", insert --¶--, therefor Signed and Sealed this
Second Day of December, 2014

Michelle K. Lee
*Deputy Director of the United States Patent and Trademark Office*

In column 9, line 20, in Claim 10, after "cells;", insert --¶--, therefor

In column 9, line 22, in Claim 10, after "and", insert --¶--, therefor

In column 9, line 27, in Claim 10, after "cell,", insert --¶--, therefor

In column 9, line 31, in Claim 10, after "array,", insert --¶--, therefor

In column 9, line 36, in Claim 10, after "mode,", insert --¶--, therefor

In column 9, line 38, in Claim 10, after "and", insert --¶--, therefor

In column 9, line 50, in Claim 11, after "location,", insert --¶--, therefor

In column 9, line 50, in Claim 11, after "comprising:", insert --¶--, therefor

In column 9, line 52, in Claim 11, after "cells;", insert --¶--, therefor

In column 9, line 54, in Claim 11, after "and", insert --¶--, therefor

In column 9, line 56, in Claim 11, after "mode,", insert --¶--, therefor

In column 9, line 61, in Claim 11, after "array,", insert --¶--, therefor

In column 10, line 47, in Claim 14, delete "motion" and insert --motion,--, therefor In column 11, line 20, in Claim 17, after "and", insert --¶--, therefor In column 12, line 1, in Claim 17, after "cell", insert --,--, therefor In column 12, line 1, in Claim 17, delete "an" and insert --any--, therefor In column 12, line 17, in Claim 18, delete "14" and insert --17--, therefor